(12) United States Patent
Suzuki

(10) Patent No.: US 6,897,161 B2
(45) Date of Patent: May 24, 2005

(54) METHOD OF CLEANING COMPONENT IN PLASMA PROCESSING CHAMBER AND METHOD OF PRODUCING SEMICONDUCTOR DEVICES

(75) Inventor: Katsunori Suzuki, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 42 days.

(21) Appl. No.: 10/361,570

(22) Filed: Feb. 11, 2003

(65) Prior Publication Data

US 2003/0150476 A1 Aug. 14, 2003

(30) Foreign Application Priority Data

Feb. 13, 2002 (JP) ........................................ 2002-035387

(51) Int. Cl.[7] .......................... H01L 21/302; B08B 9/10
(52) U.S. Cl. ...................... 438/746; 134/1.3; 134/21.18
(58) Field of Search ............................... 438/745, 746, 438/747; 134/1.3, 24, 22.18; 15/379

(56) References Cited

U.S. PATENT DOCUMENTS

| 4,444,146 | A | * | 4/1984 | De Witz et al. ............ 114/222 |
| 5,074,456 | A | | 12/1991 | Degner et al. |
| 5,217,163 | A | | 6/1993 | Henshaw |
| 5,415,697 | A | * | 5/1995 | MacDonald et al. .......... 134/26 |
| 5,569,356 | A | | 10/1996 | Lenz et al. |
| 5,574,485 | A | | 11/1996 | Anderson et al. |
| 5,707,453 | A | * | 1/1998 | Shurman et al. ................ 134/1 |
| 5,863,376 | A | | 1/1999 | Wicker et al. |
| 5,932,026 | A | * | 8/1999 | Trampusch ..................... 134/7 |
| 5,951,814 | A | * | 9/1999 | Saito et al. .............. 156/345.1 |
| 5,993,596 | A | | 11/1999 | Uwai et al. |
| 6,006,765 | A | * | 12/1999 | Skrovan et al. .............. 134/1.3 |
| 6,148,765 | A | | 11/2000 | Lilleland et al. |
| 6,237,528 | B1 | * | 5/2001 | Szapucki et al. ......... 118/723 E |
| 6,290,778 | B1 | * | 9/2001 | Zugibe .......................... 134/1 |
| 6,315,639 | B1 | * | 11/2001 | Kipp ........................... 451/38 |
| 6,336,976 | B1 | | 1/2002 | Usui |
| 6,350,007 | B1 | | 2/2002 | Meichle et al. |
| 6,493,289 | B2 | * | 12/2002 | Kitaori et al. .............. 367/189 |
| 6,530,388 | B1 | * | 3/2003 | Zuck et al. .............. 134/102.2 |

FOREIGN PATENT DOCUMENTS

| JP | 57-65370 | 4/1982 |
| JP | 05-013396 | 1/1993 |
| JP | 07-241494 | 9/1995 |
| JP | 8-243516 | 9/1996 |
| JP | 10-150016 | 6/1998 |
| JP | 10-270418 | 10/1998 |
| JP | 11-216436 | 8/1999 |
| JP | 2001-223204 | 8/2001 |

* cited by examiner

Primary Examiner—Matthew Smith
Assistant Examiner—Lex H. Malsawma
(74) Attorney, Agent, or Firm—Oliff & Berridge, PLC

(57) ABSTRACT

A component having small holes, such as a silicon electrode plate having gas nozzles, used in a plasma processing apparatus is cleaned by producing a cavitation zone that extends through an entire depth of the holes so that deposited layers on the inner walls of the holes formed during the use in the apparatus are removed. The cleaned component can subsequently be re-used in the apparatus, and the production cost and the consumption of natural resources are decreased.

27 Claims, 7 Drawing Sheets

METHOD OF CLEANING COMPONENT IN PLASMA PROCESSING CHAMBER AND METHOD OF PRODUCING SEMICONDUCTOR DEVICES

INCORPORATION BY REFERENCE

The disclosure of Japanese Patent Application No. 2002-35387 filed on Feb. 13, 2002, including specification, drawings and Abstract is incorporated herein by reference in its entirety.

BACKGROUND OF THE INVENTION

1. Field of Invention

This invention relates to a method of cleaning a component in a processing chamber of a plasma processing apparatus used in the production of semiconductor devices, and to a method of producing semiconductor devices utilizing the cleaning method.

2. Description of Related Art

Plasma processing apparatus are widely used in production of semiconductor devices. In particular, plasma processing apparatus having a processing chamber provided with parallel-plate electrodes is generally used in dry etching and chemical vapor deposition (CVD). In such plasma processing apparatus, an electrode facing a semiconductor wafer, which forms one of the parallel-plate electrodes, is used as an essential component in the processing chamber.

As an example, dry etching of a silicon oxide film used as an insulating material of a semiconductor device will now be described. This process utilizes plasma formed using a process gas atmosphere containing one or more fluorocarbon gasses.

FIG. 1 is a schematic cross-sectional view of a dry etching apparatus, which is an example of the plasma processing apparatus, used to etch silicon oxide films. A lower electrode 109 having an electrostatic chuck 108 to support a semiconductor wafer 107 is positioned at the bottom of a processing chamber, or a reaction chamber, 200. An upper electrode (a counter electrode) 100 facing the wafer 107 placed on the lower electrode 109 is positioned in a housing 111 at the top of the processing chamber 200. The upper electrode 100 and the lower electrode 109 constitute parallel-plate electrodes. A region between the parallel plate electrodes functions as a processing zone, or a reaction zone, 106.

The upper electrode 100 includes an upper electrode table 104, a gas-dispersing element 103, a cooling plate 102, and an electrode plate 101. The electrode plate 101 directly faces the processing zone 106 and functions as the electrode to generate plasma in the processing zone 106.

FIG. 2 is a plan view of the electrode plate 101. Referring to FIG. 2, the electrode plate 101 has a plurality of gas nozzles (small holes) 120 and also functions as a showerhead that uniformly supplies the process gas to the processing zone 106.

The upper electrode table 104 has a gas inlet 105 for introducing a process gas (etching gas), which is a mixture of one or more fluorocarbon gasses and some additional gasses. The process gas is uniformly supplied to the reaction zone 106 through the gas nozzles 120 of the electrode plate 101 via the gas-dispersing element 103 and the cooling plate 102. A pump (not shown) evacuates the process gas supplied to the processing zone 106 with a controlled pumping speed and a process gas atmosphere, or an etching gas atmosphere, with a controlled gas pressure is provided within the processing zone 106.

RF (radio frequency) power is applied between the electrode plate 101 of the upper electrode 100 and the lower electrode 109 from an RF power source 130 through an RF power splitter 131. Plasma of the process gas containing fluorocarbon gas or gasses (fluorocarbon plasma) is subsequently generated within the processing zone 106. Thus, the surface of the semiconductor wafer 107 is etched by active species such as radicals and ions generated within the plasma.

An upper quartz plate 110 covers the periphery of the upper electrode 100, and a lower quartz plate 112 surrounds the periphery of the lower electrode 109. In this configuration, the plasma is concentrated between the parallel-plate electrodes 100 and 109.

The size of the electrode plate 101 depends on the size of the semiconductor wafer 107 to be processed. For example, for an 8-inch semiconductor wafer 107, an electrode plate 101 having a diameter of 280 mm and a thickness of 5 mm may be used. In such a case, as shown in FIG. 2, the electrode plate 101 is provided with 640 gas nozzles 120 with a diameter of, for example, 0.5 mm.

The electrode plate 101 of the upper electrode 100 may be constructed from various materials such as aluminum or aluminum alloy with anodized surface oxide film (alumite film), carbon, or silicon. The selection of the material of the electrode plate depends on, among other things, the type of plasma generation.

For a cathode-coupled parallel-plate type plasma apparatus in which RF power is supplied to the lower electrode, aluminum or aluminum alloy with surface anodized oxide film (hereafter referred to as anodized aluminum) is commonly used. On the other hand, for an anode-couple parallel-plate type plasma apparatus in which RF power is supplied to the upper electrode, or a split-coupled parallel-plate type plasma apparatus in which RF power is supplied both to the lower and the upper electrode, carbon or silicon is used.

In the anode-coupled and the split-coupled type apparatus, the electrode plate 101 is bombarded with high-energy ions generated in the plasma, and the material of the electrode plate 101 is sputtered. If the electrode plate 101 is made from anodized aluminum, the semiconductor device processed in the plasma apparatus is contaminated with sputtered aluminum and degraded.

Although fluorocarbon plasma significantly erodes an electrode plate made from carbon or silicon, these materials do not include metal that degrades the semiconductor device. Among them, silicon is especially preferable to minimize the degradation of the semiconductor devices, because it is the main material of the semiconductor devices and can be highly purified to remove virtually all metals.

Because fluorocarbon plasma significantly erodes the electrode plate made from carbon or silicon, however, the life of these electrode plates determined by the erosion is short. That is, the shape of the electrode plate quickly changes during successive processing of a plurality of wafers and the etching characteristics changes. When the change of the etching characteristics exceeds an acceptable range, the electrode plate must be replaced with a new one.

In addition, because products produced by the reaction in the plasma deposit on components in the processing chamber, the components must be periodical cleaned or replaced with new ones. In particular, extremely high cleanness is required for the electrode plate 101 of the upper electrode 100, because it directly faces the semiconductor wafer 107.

Previously, a carbon or silicon electrode plate is used continuously to its life without cleaning it and then replaced with a new one, because the life of carbon or silicon electrode plate determined by the erosion is short. It was found that, however, the life of the carbon electrode plate is too short.

Compared with carbon, silicon has a lower erosion rate. Therefore, it is expected that a silicon electrode plate have a longer life compare with a carbon electrode plate.

However, this inventor has found that the continuous usage of a silicon electrode plate is limited by the deposition of reaction products within the gas nozzles before the life determined by the erosion. That is, before the etching characteristics are degraded due to the erosion, a large number of particles are generated from the reaction products deposited in the gas nozzles. Such particles significantly decrease the yield of the semiconductor devices processed in the etching apparatus, and make it impossible to continue the usage of the electrode plate.

This inventor has also found that the reaction products deposited on a silicon electrode plate cannot be removed by cleaning methods that are used for cleaning components formed with other materials. Therefore, it was impossible to clean and re-use the silicon electrode plate after it is used until the reaction products are deposited and particles are generated. In other words, although the life, or the intrinsic life, of the silicon electrode plate determined by the erosion is long, the effective life is limited by the deposition of reaction products.

In fact, this inventor has found that the effective life of the silicon electrode plate is about the same as that of the carbon electrode plate, which has much shorter intrinsic life. Thus, it is required to keep a large number of electrode plates as replacement parts so that the electrode plate reached the effective life can be readily replaced, even though the electrode plate is made from silicon that has a long intrinsic life. As a result, the production cost and the consumption of natural resourced required for the replacement parts are increased.

Such findings by this inventor are also described in Japanese Unexamined Patent Application Publication No. 2002-231699, which is incorporated by reference in its entirety.

SUMMARY OF THE INVENTION

An object of the present invention is to provide a method of cleaning a component having small holes such as an electrode plate used in a plasma processing apparatus that can remove deposited layers formed within the small holes during the usage in the processing apparatus, so that the component can be re-used.

Another object of the present invention is to provide a method of producing semiconductor devices including re-using a component cleaned by the method of cleaning, so that the production cost and the consumption of natural resourced can be decreased.

In accordance with a method of the invention, an electrode plate used in a plasma processing apparatus is cleaned. The electrode plate has a plurality of gas nozzles through which a process gas is supplied to a processing zone of the plasma processing apparatus, the gas nozzles pass through an entire thickness of the electrode. The method includes immersing the electrode plate in an cleaning agent and removing deposited layers on inner walls of the gas nozzles formed when the electrode plate is used in the plasma processing apparatus, the removing includes radiating ultrasonic waves toward a surface of the electrode plate having openings of the plurality of gas nozzles from an ultrasonic wave radiation surface of a horn connected to an ultrasonic vibrator, a power density of the ultrasonic waves defined by a ratio of an electric power input to the ultrasonic vibrator to an area of the ultrasonic wave radiation surface being not lower than 5 $W/cm^2$.

In accordance with another method of the invention, an electrode plate used in a plasma processing apparatus is cleaned. The electrode plate has a plurality of gas nozzles through which a process gas is supplied to a processing zone of the plasma processing apparatus, the gas nozzles pass through an entire thickness of the electrode plate. The method includes immersing the electrode plate in an cleaning agent and removing deposited layers on inner walls of the gas nozzles formed when the electrode plate is used in the plasma processing apparatus, the removing including producing a cavitation zone that extends through an entire depth of at the gas nozzles.

A method of producing semiconductor devices in accordance with the invention can include attaching an electrode plate in a plasma processing apparatus. The electrode plate has a plurality of gas nozzles through which a process gas is supplied to a processing zone of the plasma processing apparatus, the gas nozzles pass through an entire thickness of the electrode plate. The method of producing semiconductor devices can also include processing a first plurality of semiconductor devices in the processing zone while forming deposited layers on inner walls of the gas nozzles, detaching the electrode plate from the plasma processing apparatus and cleaning the detached electrode plate. The cleaning includes immersing the detached electrode plate in a cleaning agent and removing the deposited layers from inner walls of the gas nozzles, the removing including producing a cavitation zone extending through an entire depth of the gas nozzles. The method of producing semiconductor devices can further include re-attaching the cleaned electrode plate to the plasma apparatus and processing a second plurality of semiconductor devices in the plasma apparatus.

Finally, in accordance with another method of the invention, a component used in a plasma processing apparatus is cleaned. The component has a plurality of holes through which a process gas is supplied to a processing zone of the plasma processing apparatus, the holes pass through an entire thickness of the component. The method includes immersing the component in an cleaning agent and removing deposited layers on inner walls of the holes formed when the component is used in the plasma processing apparatus, the removing including producing a cavitation zone that extends through an entire depth of the holes.

DETAILED DESCRIPTION OF EXEMPLARY EMBODIMENTS

Before explaining the preferred embodiments, results of analysis of deposited layers on inner walls of gas nozzles of the silicon electrode plate and unsuccessful efforts to remove the deposited layers by conventional cleaning methods will be explained.

Figure 3A:
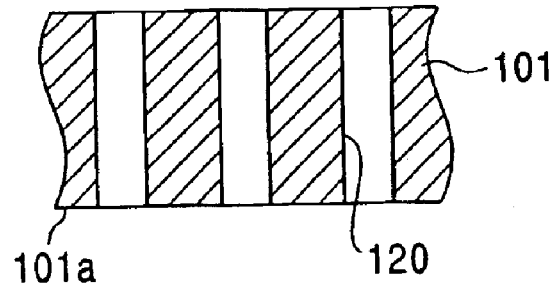
FIG. 3A is a longitudinal cross-sectional view of a silicon electrode plate before using in a dry etching apparatus.

FIG. 3A is a longitudinal cross-sectional view of the silicon electrode plate 101 before using in the etching apparatus. As shown in FIG. 3A, the gas nozzles 120 extend straightly across the thickness of the silicon electrode plate 101 with a constant diameter.

Figure 3B:
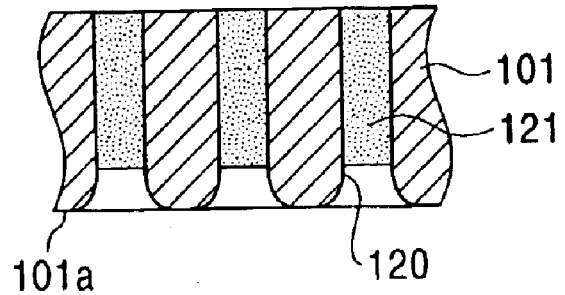
FIG. 3B is a longitudinal cross-sectional view of a silicon electrode plate after the use in a dry etching apparatus.

FIG. 3B is a longitudinal cross-sectional view of the silicon electrode plate 101 after it is used in the etching apparatus to the effective life. The gas nozzles 120 are enlarged by the erosion during the usage in the etching apparatus into a funnel shape near the opening at one surface 101a, which face the semiconductor wafer 107 when the electrode plate 101 is attached to the etching apparatus.

As shown in FIG. 3B, cylindrical deposited layers 121 of reaction products are formed on the inner walls of the gas nozzles 120. The deposited layers 121 have a thickness of about 3 $\mu$m. According to the results of energy dispersion X-ray spectroscopy of the deposited layer 121, only peaks of light elements such as C, F, and O were observed and no Si peak was observed. The result suggests that the deposited layer 121 is composed of fluorinated polymers that are formed by decomposition and polymerization of the fluorocarbon gasses used for the etching of silicon oxide films.

The deposited layer 121 shown in FIG. 3B are also formed on inner walls of gas nozzles 120 of electrode plates constructed from other materials, such as carbon and anodized aluminum. Hereinafter, the deposited layers 121 are referred to as $CF_x$ polymer layers 121 in this specification.

The $CF_x$ polymer layers are also formed on other components that attached in the processing chamber 200 and are exposed to the plasma generated in the processing zone. As described in Japanese Unexamined Patent Application Publication No. 2002-231699, however, this inventor has found that the structure of the $CF_x$ polymer layers formed on such components is different from that of the $CF_x$ polymer layers 121 formed on the inner walls of the gas nozzles 120.

Components exposed to the plasma other than the upper electrode plate 101 are mainly composed of quartz or anodized aluminum. The $CF_x$ polymer layers formed on the surfaces of these components can be readily removed with fluorinated organic solvent by swelling. On the other hand, the $CF_x$ polymer layers 121 in the gas nozzle 120 are not substantially swelled in the fluorinated organic solvent. Thus, the $CF_x$ polymer layer 121 in the gas nozzles 120 cannot be removed with the fluorinated organic solvent that is generally used for cleaning components in plasma reaction chambers.

The $CF_x$ polymer layers on the surfaces of the other components are formed by deposition of reaction products, or by-products, produced in the processing zone 106, in which the pressure of the fluorocarbon gas is relatively low. On the other hand, the $CF_x$ polymer layers 121 on the inner walls of the gas nozzles 120 are formed by plasma-enhanced chemical vapor deposition within the gas nozzles 120, in which the pressure of the fluorocarbon gas is much higher than that in the processing zone.

Such difference in the formation conditions is considered to be the origin of the difference in the structure of the $CF_x$ polymer layers. In fact, for example, the deposition rate of the $CF_x$ polymer layers 121 in the gas nozzles 120 was less than or equal to about 1% of the rate on the surface of a $SiO_2$ component exposed to the plasma.

Further, in the case of the silicon electrode plate, an intermediated layer between the $CF_x$ polymer layer 121 and the underlying silicon inner wall of the gas nozzle 120 formed by the reaction between them was found. This intermediate layer seems to increase the adhesion strength of the $CF_x$ polymer layer 121 to the inner wall of the gas nozzle 120.

Because of this structural difference, fluorinated organic solvent cleaning, which is generally used for cleaning components in plasma processing chambers, cannot be used as a cleaning method for the electrode plate 101 having gas nozzles 120.

Another method generally used for removing the $CF_x$ polymer layer is the dry cleaning using plasma generated with a cleaning gas atmosphere. The dry cleaning method is effective for portions that are effectively exposed to the plasma. However, the dry cleaning method is not effective for the inner walls of the gas nozzles 120 that are not effectively exposed to the plasma.

Therefore, in order to clean the silicon electrode plate, other cleaning methods were examined.

Now, the preferred embodiments of the method of cleaning a component and the method of producing semiconductor devices will be described with reference to the accompanying drawings.

Figure 2:
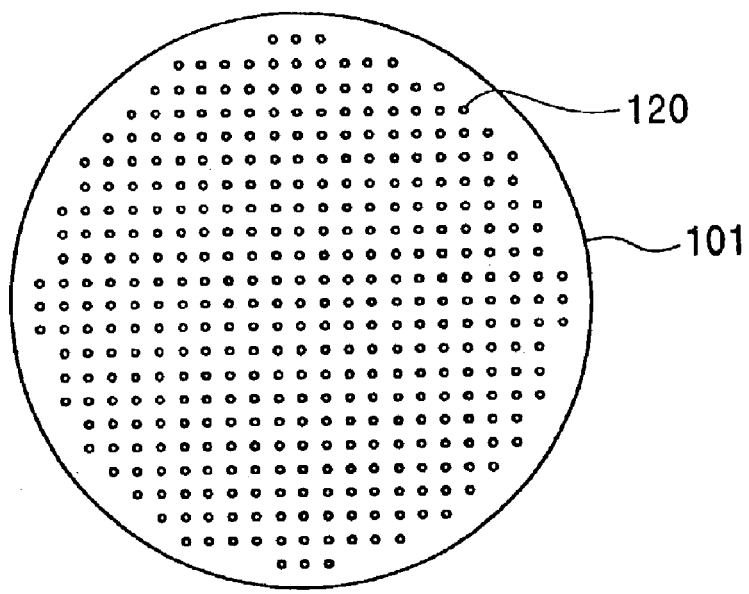
FIG. 2 is a plan view of a silicon electrode plate used in a dry etching apparatus.
Figure 4:
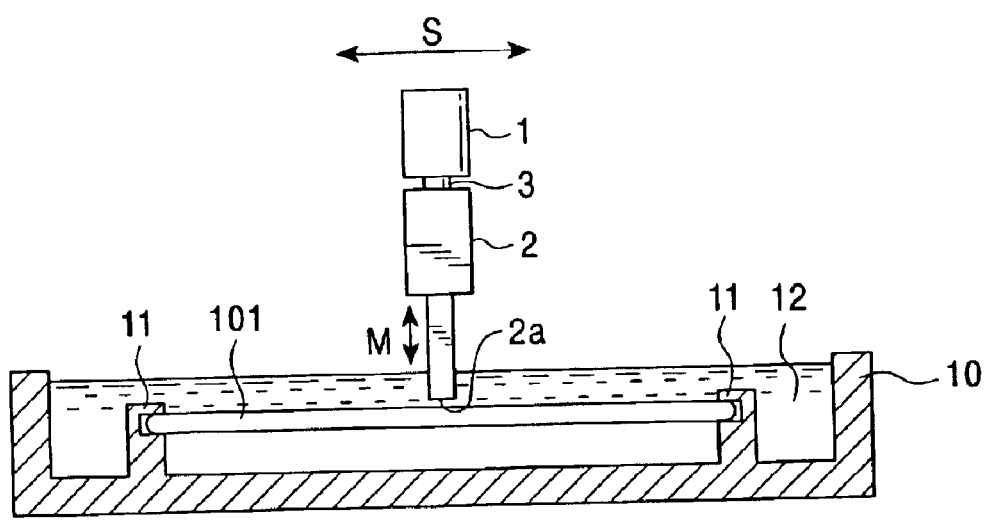
FIG. 4 is an exemplary schematic cross-sectional view of a cleaning apparatus for a cleaning method according to an embodiment of this invention.

FIG. 4 is an exemplary schematic cross-sectional view of a cleaning apparatus used for the method of cleaning the component according to this invention. In the following embodiment, a silicon electrode plate 101 shown in FIG. 2 is used as an example of the component subjected to the cleaning.

Referring to FIG. 4, the cleaning apparatus has a cleaning vessel 10 provided with electrode clamps 11. The cleaning vessel 10 is filled with a cleaning solvent 12, for example, pure water. The electrode clamps 11 hold peripheral portions of a silicon electrode plate 101. An ultrasonic vibrator 1 is placed above the cleaning vessel 10 and is connected to a horn 2 with a connector 3 provided therebetween. The leading end 2a of the horn 2 is placed in the solvent 12 such that the leading end 2a is in proximity to the upper surface of the silicon electrode plate 101.

Upon energizing the ultrasonic vibrator 1, ultrasonic waves generated in the ultrasonic vibrator 1 propagate through the connector 3 and the horn 2 to vibrate the leading end 2a of the horn 2 in the direction M perpendicular to the surface of the silicon electrode plate 101. Ultrasonic waves are radiated from the leading end 2a toward the silicon electrode plate 101. That is, the leading end 2a acts as an ultrasonic wave radiation surface. A region, in the vicinity of the leading end 2a, of the silicon electrode plate 101 is irradiated with the ultrasonic waves.

The area of the leading end 2a radiating the ultrasonic waves determines the area to be irradiated on the silicon electrode plate 101. Optimization of the shape of the horn 2 enables amplification of the ultrasonic vibration. Amplitude larger than that of the ultrasonic vibrator 1 can thereby be output at the leading end 2a of the horn 2.

The ultrasonic vibrator 1 has a drive mechanism (not shown in the drawing) that is connected to a drive source (not shown in the drawing), so that the ultrasonic vibrator 1 with the horn 2 is movable in the radial direction S of the silicon electrode plate 101.

Before placing the electrode plate 101, the vessel 10 was filled with pure water 12 and the ultrasonic vibrator 1 was operated. Vigorous generation of bubbles was observed over a depth corresponding to or exceeding the thickness of the electrode plate within the range of ultrasonic power density that exhibits a cleaning effect, as described below. In other words, a cavitation zone, or a zone where cavitation occurs was produced such that the zone extends over an entire area corresponding to the thickness of the electrode plate.

When the silicon electrode plate 101 was placed and irradiated with ultrasonic waves, bubbles vigorously belching from openings of the gas nozzles 120 at the surface opposite to the irradiating surface of the electrode plate 101 were observed. Accordingly, radiation of ultrasonic waves with the power density that exhibits the cleaning effect produces a cavitation zone extending through the entire depth of the gas nozzles 120, or, over the entire region from the openings at the irradiated surface of the electrode plate 101 to the other openings at the other surface.

For cleaning the silicon electrode plate 101 in the cleaning apparatus shown in FIG. 4, the ultrasonic vibrator 1 is scanned across the radial direction S, while producing the cavitation zone in the pure water 12 across the entire thickness of the silicon electrode plate 101. Thereby, all of the gas nozzles 120 are cleaned.

The cavitation, in this case is "steam cavitation." For example, a liquid containing supersaturated gas generates cavitation called gaseous cavitation at low ultrasonic power densities. The cavitation utilized in this invention is different from such gaseous cavitation and is generated only at ultrasonic power densities higher than a certain level.

It was found that the $CF_x$ polymer layers 121 formed in the gas nozzles 120, which cannot be removed with a fluorinated organic solvent, could be removed by the cleaning method according to this invention. In this cleaning method shown in FIG. 4, the ultrasonic power density defined by the ratio of the input electric power to the ultrasonic vibrator 1 to the area of the leading end (ultrasonic wave radiation surface) 2a of the horn 2 is at least 5 $W/cm^2$. Thereby, a cavitation zone extending over the entire region across the thickness of the silicon electrode 101, which is effective for removing the $CF_x$ polymer layers 121 in the gas nozzles 120, is produced.

An ultrasonic power density of less than 5 $W/cm^2$ does not produce a sufficient physical cleaning effect that is necessary for removing the $CF_x$ polymer layers 121 deposited on the inner walls of the gas nozzles 120 of the silicon electrode plate 101.

The upper limit of the ultrasonic power density has not yet confirmed. In practice, the upper limit is preferably 35 $W/cm^2$. For obtaining an ultrasonic power density exceeding 35 $W/cm^2$, the area of the leading end 2a of the horn 2 must be minimized, resulting in a reduced cleaning area at a selected position of the ultrasonic vibrator 1. As a result, the ultrasonic vibrator 1 should be scanned for a significantly long time for cleaning the entire silicon electrode plate 101. Furthermore, erosion on the component may occur during the cleaning depending on the material used to construct the component.

The type of the ultrasonic vibrator 1 is not limited. However, standard ultrasonic vibrators cannot generate a power density equal to or more than 5 $W/cm^2$. Thus, the use of the horn 2 is preferable in practical view, in place of direct emission of ultrasonic waves from the ultrasonic vibrator 1. The horn 2 amplifies the vibration of the ultrasonic waves and thus enhances the ultrasonic power density.

In this embodiment, the cleaning solvent 12 is preferably pure water. The temperature of the pure water 12 is preferably in the range of 40° C. to 60° C. The immersion depth of the horn 2 in the cleaning solvent is preferably in the range of 5 to 15 mm.

The distance between the leading end 2a of the horn 2 and the surface of the silicon electrode plate 101 is preferably 3 mm or less. Such a short distance ensures a higher cleaning effect. The leading end 2a of the horn 2 cannot be in contact with the silicon electrode 101. Thus, the distance between the leading end 2a and the surface of the silicon electrode plate 101 must be larger than the amplitude of the leading end 2a. Because the amplitude of the leading end 2a is about 30 $\mu m$ in this embodiment, the distance must be larger than 30 $\mu m$.

Preferably, the silicon electrode plate 101 is placed such that the leading end 2a of the horn 2 faces the surface 101a at which gas nozzles 120 diverge. The cavitation zone readily enters the gas nozzles 120 to enhance the cleaning effect. In addition to the cleaning from the surface 101a, cleaning from the other surface of the silicon electrode plate 101 further enhances the cleaning effect.

It was found that higher ultrasonic power densities improve the cleaning effect. Therefore, the cleaning mechanism is explainable by the steam cavitation effect, i.e., a physical effect by high-pressure impulse waves generated when the bubbles in the cavitation zone disappear. If the ultrasonic energy directly effects the cleaning, a large number of bubbles generated by the cavitation would preclude propagation of the ultrasonic energy and thus would decrease the cleaning effect.

In this invention, the frequency of the ultrasonic wave is preferably in the range of 15 kHz to 50 kHz that can readily generates steam cavitation. More preferably, the frequency is in the range of 15 kHz to 30 kHz that can be amplified by the horn 2. The horn 2 can amplify the amplitude to, for example, 20 times to 40 times of that of the ultrasonic vibrator 1.

In this invention, the cavitation zone extends across the entire thickness of the silicon electrode plate 101. The ultrasonic vibrator 1 may be replaced with, for example, a water jet nozzle described in Japanese Unexamined Patent Application Publication No. 7-241494 in which a high-pressure water stream is jetted in a liquid to generate cavitation. In such a case, the cavitation is generated by a combined effect of disturbance of a jet stream occurring in the liquid and the shearing effect of the jet stream to the surrounding liquid.

For further improving the cleaning effect, another cleaning step may be utilized in combination with the cleaning by the cavitation.

As described in Japanese Unexamined Patent Application Publication No. 2002-231699, this inventor also examined various chemical and physical cleaning methods. As explained before, the ultrasonic cleaning according to this invention itself utilizes a physical effect produced by the cavitation. Therefore, as the physical cleaning method to be combined with the ultrasonic cleaning, methods other than ultrasonic cleaning were examined.

As for the chemical cleaning, cleanings with some acidic chemical solutions were found to be effective to some extent. In particular, immersion in buffered hydrofluoric acid solution (an aqueous solution including 6 wt % hydrofluoric acid and 30 wt % ammonium fluoride) or a hydrofluoric-nitric acid solution (an aqueous solution including 1 wt % hydrofluoric acid, 50 wt % nitric acid and 30 wt % glacial acetic acid) were found to be effective to remove the $CF_x$ polymer layers 121 in the gas nozzles 120 of a silicon electrode plate.

The solutions found to be effective cannot dissolve the $CF_x$ polymer, but can etch silicon. Therefore, such solutions can remove the $CF_x$ polymer layers by etching underlying silicon layers and lifting-off the $CF_x$ polymer layers.

However, such chemical cleaning has drawbacks. That is, cleaning with solutions that etch silicon enlarges the diameter of the gas nozzles and increases microroughness on the inner walls of the gas nozzles 120. Such enlargement of the gats nozzles and increase of microroughness may alter the etching characteristics. In addition, different chemical solutions should be selected for components with different materials.

As for the physical cleaning, some kinds of blast cleanings such as sand blasting or dry honing were found to be effective to some extent. In particular, a blast cleaning using dry ice pellets was found to be effective to remove the $CF_x$ polymer layers 121 in the gas nozzles 120 of a silicon electrode plate.

In contrast with the cleaning with chemicals that etch silicon, the blast cleaning does not etch or otherwise damage silicon. That is, neither the increase of the diameter nor the increase of microroughness on the inner walls of the gas nozzles formed in a silicon electrode plate was observed.

However, the cleaning effect of the blast cleaning is limited. That is, the blast cleaning cannot remove the $CF_x$ polymer layers 121 along the entire depths of the gas nozzles 120 formed in a 5 mm thick silicon electrode plate. In particular, although the pellets are blasted from both of the surfaces of the electrode plate, the $CF_x$ polymer layer 121 is remained around a certain position near the opening of the gas nozzle that is not enlarged.

When the pellets are blasted from the surface of the electrode plate at which the gas nozzle is enlarged, the pellets efficiently enter the gas nozzle and bombard the $CF_x$ polymer layer 121 on the inner surface of the gas nozzle. Therefore, the $CF_x$ polymer layer 121 is effectively removed at the region extending from the enlarged opening to a certain depth of the gas nozzle. But the removing effect does not reach to the opening at the other surface. When the pellets are blasted from the other surface, the pellets cannot efficiently enter the gas nozzle from the opening that is not enlarged. In addition, the pellets that entered into the gas nozzle fly almost in parallel with the inner surface of the gas nozzle, and cannot effectively bombard the $CF_x$ polymer layer 121. Therefore, the $CF_x$ polymer layer 121 is removed only at the region close to the opening.

As explained above, the effect of the blast cleaning is limited. However, a combination of the cleaning with cavitation and the blast cleaning was found to be effective. In particular, it was found that the blast cleaning could remove the $CF_x$ polymer layers 121 that partially remained after the cleaning utilizing the cavitation.

That is, although the cavitation cleaning can remove most of the $CF_x$ polymer layer 121 in the gas nozzles, there are cases that $CF_x$ polymer layers 121 remain in small portions within the gas nozzles. The remained $CF_x$ polymer layers 121, or residues, are partially separate from the inner walls of the gas nozzles 120 after the cavitation cleaning. Thus, during the blast cleaning, pellets entering the gas nozzles 120 effectively blast and facilitate separation of the remained $CF_x$ polymer layers 121. Accordingly, cleaning in the gas nozzles 120 is further improved.

The blast cleaning is preferably performed from the surface 101a of the electrode plate 101 having enlarged openings of the nozzles 120 through which the pellets readily enter. More preferably, the blast cleaning is also performed from other surface.

As described above, in this invention, cavitation zone is produced across the entire depth of the gas nozzles 120 of the silicon electrode plate 101 to effectively remove the $CF_x$ polymer layers 121 deposited on the inner walls of the gas nozzles 120. This process does not damage the surface of the silicon electrode plate 101. It does not increase microroughness on the inner walls of the gas nozzles 120 or expands the diameter of the gas nozzles. Thus, the cleaned component, i.e., the silicon electrode plate 101 can be repeatedly used up to its life determined by the erosion.

The cleaning method according to this invention can also remove other contaminants as well as the $CF_x$ polymer layers 121. The cleaning method can also remove depositions on components other than the silicon electrode plate 101. During the cleaning step, the horn 2 is scanned across the radial direction S in this embodiment. If the long side (perpendicular to the direction S) of the horn 2 is smaller than the region where the gas nozzles 120 are formed, the horn 2 may be scanned several times. If the long side of the horn 2 is the same as the radius of the silicon electrode 101, the horn 2 may be rotated clockwise or counterclockwise over the silicon electrode plate 101.

In the embodiment, a silicon electrode plate 101 having gas nozzles 120 is cleaned utilizing the cavitation. The diameter of the gas nozzles is typically 0.5 mm. However, the diameter of the gas nozzles may range from about 0.3 mm to about 0.8 mm. The cleaning method utilizing the cavitation is effective to clean electrode plates having gas nozzles with the diameter in at least this range.

The cleaning method according to this invention is also applicable to electrode plates constructed with other materials such as carbon and anodized aluminum. Further, the cleaning method is applicable to various other components having small holes. For example, in an inductively coupled plasma processing apparatus such as shown in U.S. Pat. No. 5,863,376, a gas distribution plate, which also acts as a dielectric window to introduce RF power into the chamber, is used. Such gas distribution plate also has a plurality of small holes to distribute a process gas into the processing zone, and may be cleaned by the cleaning method according to this invention.

The holes are preferably pass through an entire thickness of the component, or, more preferable, straightly pass through the entire thickness of the component. Thereby, the inner surfaces of the small holes are effectively cleaned by the cavitaion generated across the entire thickness of the component.

Next, the method of producing semiconductor devices according to this invention will be described. This method includes a step of cleaning a component of a plasma processing apparatus for processing semiconductor devices by the above-described method of cleaning, in order to repeatedly use the component. The component that is cleaned and re-used is, for example, the silicon electrode plate 101 shown in FIG. 2.

Figure 1:
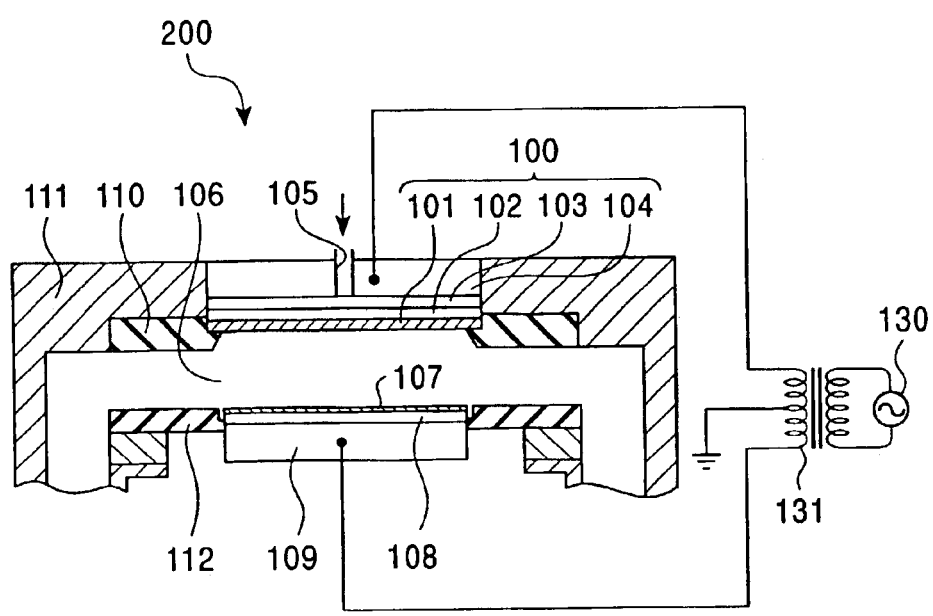
FIG. 1 is a schematic cross-sectional view of a dry etching apparatus.

The dry etching apparatus shown in FIG. 1, for example, is used in the method of producing semiconductor devices according to this invention. In this invention, however, the plasma processing apparatus is not limited to the apparatus shown in FIG. 1. The RF power may be applied through anode coupling, cathode coupling, or split coupling. Any RF frequencies may be used for generating plasma. The plasma excitation may be magnetically assisted.

In the method of producing semiconductor devices according to this invention, the timing for the cleaning may be appropriately determined. For example, for the silicon electrode plate 101 shown in FIG. 2, formation of particles becomes noticeable when the accumulated time of RF discharge reaches about 150 hours. Therefore, the silicon electrode plate 101 may be cleaned at, for example, an accumulated time of about 100 hours.

The cleaned component having small holes is repeatedly used in the present invention. The number of the particles produced in the reaction zone of the plasma processing apparatus can be reduced to the level essentially same as that in the case of using a new component. Thus, the plasma processing apparatus maintains the initial performance, or production yield, without replacing the component with a new one. Furthermore, reduction of number of necessary replacement components reduces the production cost saves natural resources.

Now, examples according to the cleaning method and production method of this invention will be explained in detail.

EXAMPLE 1

Firstly, the dependence of the cleaning effect on the ultrasonic power density is measured.

A carbon electrode plate, and a silicon electrode plate are prepared and used in the dry etching apparatus shown in FIG. 1 for 100 hours (carbon electrode plate) or 150 hours (silicon electrode plate) of accumulated RF discharge time. An anodized aluminum electrode is also prepared and used in a cathode-coupled parallel-pate type etching apparatus for 100 hours. Each electrode plate has an outer diameter of 280 mm and a thickness of 5 mm, and has gas nozzles with a diameter of 0.5 mm that are arranged at a pitch of 7 mm. Each of the used electrode plates is placed in the cleaning apparatus shown in FIG. 4 such that the surface 101a of the electrode plate, which faces the semiconductor wafer in the etching apparatus, faces the horn 2. And ultrasonic waves are applied to the electrode plates through the horn 2.

The horn 2 is composed of stainless steel and had a leading end 2a with a rectangular shape. The leading end 2a has a long side of 150 mm and a short side of 25 mm. Ultrasonic waves are radiated from the leading end 2a. Thus, the area of the ultrasonic wave radiation is 37.5 cm$^2$.

The horn 2 may have any shape depending on the shape of the workpiece to be cleaned, required power density, shape of the ultrasonic vibrator 1, and input power and frequency of the ultrasonic waves. The horn 2 may be composed of duralumin, titanium alloy, or the like, instead of stainless steel. The leading end 2a is generally flat. When the leading end 2a is curved or has an irregularity generated during a long-term use, the power density may be determined by calculating a projected area perpendicular to the axis of ultrasonic radiation.

While radiating the ultrasonic waves, the ultrasonic vibrator 1 and the horn 2 are scanned in the direction S at a rate of 2.5 mm/min. Ultrasonic wave radiation is made at an oscillation frequency of 15 kHz to 28 kHz, and with an input electric power to the ultrasonic vibrator 1 of 75 W to 1,300 W. The long side of the leading end 2a is perpendicular to the scanning direction S. Because the ultrasonic waves are radiated in a range of 25 mm along the scanning direction, which is the length of the leading end 2a along the scanning direction, each of the gas nozzles 120 is irradiated with the ultrasonic waves for 10 minutes.

The immersion depth of the leading end 2a of the horn 2 is 10 mm and the temperature of the pure water 12 is 50° C. The distance from the leading end 2a of the horn 2 to the surface 101a of the silicon electrode plate 101 is 3 mm.

After the ultrasonic cleaning, each electrode plate is finally cleaned in pure water for 10 minutes and then in isopropyl alcohol for 10 minutes. Ultrasonic waves with a frequency of 25 kHz and the power density of 0.5 W/cm$^2$ are applied during these final cleaning steps. As will be explained later, this power density is far smaller than the range found to be effective to remove the CF$_x$ polymer layers 121. Therefore, the final cleaning itself is not considered to be effective to remove the CF$_x$ polymer layers 121.

Figure 5:
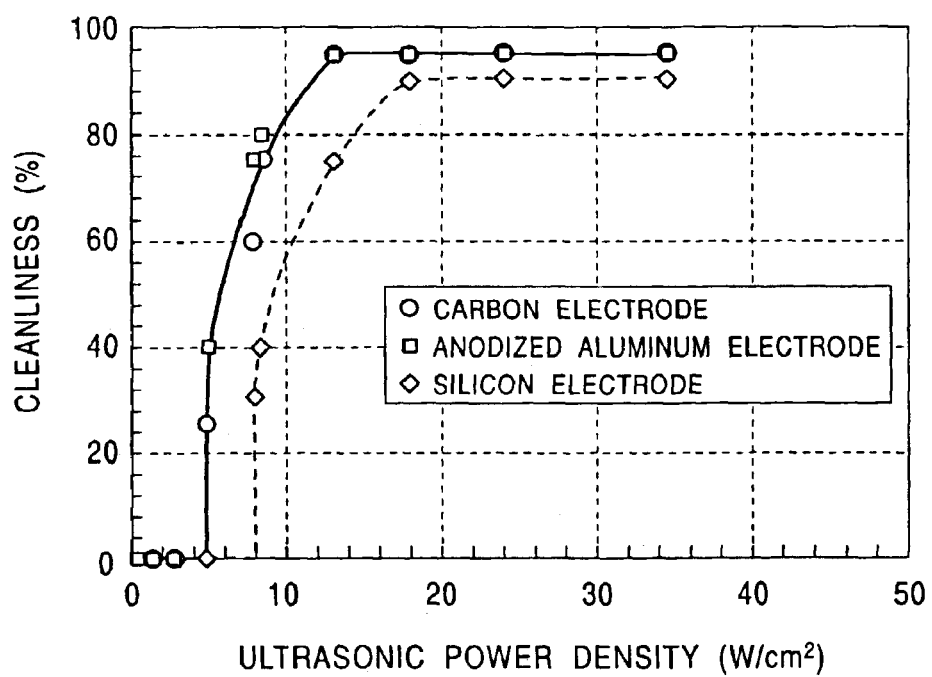
FIG. 5 is an exemplary graph showing the relationship between the cleanliness and the ultrasonic power density.

After the final cleaning, each electrode is cut to expose the cross-sections of the gas nozzles 120. The cut surface is observed by scanning electron microscopy (SEM) to see if the CF$_x$ polymer layers 121 are removed or remained. The results are shown in FIG. 5 that is an exemplary graph illustrating the relationship between the cleanliness and the ultrasonic power density. The cleanliness at the vertical axis indicates the ratio of the gas nozzles from which the CF$_x$ polymer layers 121 are completely removed in twenty observed gas nozzles 120.

As shown in FIG. 5, for electrode plates of carbon or anodized aluminum, the cleaning effect (removal of the CF$_x$ polymer layers) is observed at an ultrasonic power density of 5 W/cm$^2$ or more. And a high cleanliness of 95% or more is observed at an ultrasonic power density of 13 W/cm$^2$ or more. For silicon electrode plates, the cleaning effect is observed at 8 W/cm$^2$ or more, and a high cleanliness of 90% or more is observed at an ultrasonic power density of 18 W/m$^2$ or more. These results show that cleaning effects are achieved at a threshold ultrasonic power density or more, although the threshold power density varies with the material of the electrode plate.

Therefore, for carbon and anodized aluminum electrode plates, the ultrasonic power density of 5 W/cm$^2$ or more is effective, and the power density of 13 W/cm$^2$ or more is preferable. For silicon electrode plates, the power density of 8 W/cm$^2$ or more is effective, and the power density of 18 W/cm$^2$ or more is preferable The cavitation zone that extends across the entire thickness (5 mm) of the electrode plate is observed at an ultrasonic power density of 5 W/cm$^2$, at which the cleaning effect is observed for carbon and anodized aluminum alloy electrode plates. Therefore, the cavitation must be produced through the entire depth of the gas nozzles to remove the CF$_x$ polymer layers deposited on the inner walls of the gas nozzles.

Further, a higher ultrasonic power density is required to achieve a sufficiently high cleanliness. The higher ultrasonic power density increases the bubble density in the cavitation zone and increases the cleaning ability.

When the ultrasonic power density is within the range where the high cleanliness is obtained, the CFx polymer layers are almost completely removed even in the gas nozzles where residues of the CFx polymers layers are observed. That is, small residues of the CFx polymer layers that are partially removed are observed at random locations.

There is no indication that the cleaning effect reaches only to a certain depth from the irradiated surface. Therefore, similarly high cleanliness would be achieved for gas nozzles in a thicker electrode plate.

After cleaning at an ultrasonic power density exceeding 35 W/cm$^2$, erosion is observed on the surface of an anodized aluminum electrode plate, particularly in the vicinity of openings of the gas nozzles. No erosion is observed on the carbon and silicon electrode plates at an ultrasonic power density exceeding 35 W/cm$^2$. However, it is necessary to reduce the area of the leading end 2a of the horn 2 in order to increase the ultrasonic power density above 35 W/cm$^2$, resulting in a longer time for cleaning the entire electrode plate. Furthermore, such a high ultrasonic power density exceeding 35 W/cm$^2$ causes severe vibration of the horn 2 that limits the continuous operation of the cleaning process.

Accordingly, for electrode plates with all examined materials, a practical upper limit of the ultrasonic power density is about 35 W/cm$^2$.

In EXAMPLE 1, only one surface of the electrode plate is irradiated with ultrasonic waves. Additional irradiation from the other surface will further facilitate the cleaning.

Concerning ultrasonic cleaning using a horn, Japanese Unexamined Patent Application Publication No. 8-243616 discloses a method of enhancing the cleaning effect. In this method, the square of the ultrasonic wavelength in the cleaning solvent is controlled to be less than the area of the ultrasonic radiation surface of the horn. According to experiments by this inventor, however, such a relationship was not observed. In fact, with the horn 2 used in this example, at a frequency of 15 kHz, the square of the ultrasonic wavelength is larger than the area of the leading end 2a, which is the ultrasonic radiation surface.

Therefore, the shape and the size of the horn 2 can be determined depending on a required power intensity and a shape of the workpiece to be cleaned, including the cases that the square of the ultrasonic wavelength is larger than the area of the leading end 2a. For example, as in this example, the leading end 2a of the horn 2 can be made narrow and long and the horn 2 can be scanned perpendicularly to the longitudinal direction. Thereby, the area that can be cleaned by one scanning step is maximized. As a result, the scanning mechanism of the cleaning apparatus can be simplified.

EXAMPLE 2

In EXAMPLE 2, the removal effect of the CFx polymer layer is evaluated by combining the cavitation cleaning method with a physical cleaning method.

Electrode plates of which the cleanliness is not 100% in EXAMPLE 1 are subjected to a physical cleaning step. And the removal effect of the CF$_x$ polymer layers 121 is examined.

The same electrode plates as those in EXAMPLE 1 are cleaned at an ultrasonic power density of 24 W/cm$^2$. The cleanliness of the carbon and anodized aluminum electrode plate is 95%, and that of the silicon electrode plate is 90%. In the case of the anodized aluminum electrode plate, partly remained CFx polymer layers are observed. In the case of the silicon electrode plate, in addition to the partly remained small CFx polymer layers, intermediate layers between the inner walls of the gas nozzles and the CFx polymer layers are also observed. The intermediate layer was identified as a SiC-like compound layer having a thickness of about 0.1 μm.

After the ultrasonic cleaning, a physical cleaning, namely, a blast cleaning is performed with dry ice pellets. The dry ice pellets have a diameter of 0.3 mm and are prepared by roller pulverization. The dry ice pellets are discharged with an air pressure of 8 kg/cm$^2$ (780 kPa) to form a pellet stream. The both surfaces of the electrode plate are irradiated, one at a time, with the pellet stream at a rate of 5 seconds per gas nozzle.

Next, the final cleaning is performed as in EXAMPLE 1. The inner walls of the gas nozzles 120 are observed as in EXAMPLE 1 to evaluate the cleanliness. The cleanliness of all of the carbon, anodized aluminum, and silicon electrode plates is 100%. The CFx polymer layers and the intermediate layers are completely removed from the inner walls of the gas nozzles 120. From this result, the effectiveness of the combination of the cavitation cleaning and the physical cleaning is confirmed.

The size and the discharge pressure of the dry ice pellets, and the irradiation time of the pellet stream may be appropriately determined depending on the thickness of the CFx polymer layers, the thickness of the intermediate layers, the diameter of the gas nozzles, and so on.

In the blast cleaning, the pellet stream is preferably directed perpendicular to the surface of the electrode plate, in other words, parallel to the depth of the gas nozzles 120, so that the pellets can reach the deep portions in the small holes. In this case, the pellet stream becomes almost parallel to the inner wall of each gas nozzle 120. Therefore, the blast cleaning alone is not effective to remove CFx polymer layers at the deep portions within the gas nozzles 120.

In this example, however, the blast cleaning is made after the ultrasonic cleaning with a power density sufficient to produce a cavitation zone through the entire depth of the gas nozzles 120. The pellets in the stream parallel to the depth of the gas nozzles 120 blast partially removed CFx polymer layers and intermediate layers remained after the ultrasonic cleaning, and carry the detached layers out of the gas nozzle 120. Accordingly, high cleanliness is achieved.

With an appropriate controlling of the discharge pressure, the blast cleaning does not have an etching effect on the base materials, i.e., carbon, anodized aluminum alloy, or silicon. Therefore, the physical cleaning does not cause increase of the diameter of the gas nozzles 120. Further, no increase of microroughness on the inner walls of the gas nozzles 120 or on the surface 101a and the rear surface of the electrode plate occurs.

EXAMPLE 3

As an example of the method of producing semiconductor devices according to this invention, silicon dioxide films (hereinafter referred to as SiO$_2$ films) were etched using an electrode plate cleaned by the cleaning method according to this invention.

In a dry etching apparatus as shown in FIG. 1, SiO$_2$ films were etched. After a predetermined accumulated etching time, the silicon electrode plate 101 shown in FIG. 2 was cleaned. Using the cleaned silicon electrode plate 101, further dry etchings were performed to evaluate the number of particles generated from the silicon electrode plate 101.

The silicon electrode plate 101 has a diameter of 280 mm, a thickness of 5 mm, and has 640 gas nozzles 120 with a diameter of 0.5 mm arranged at a pitch of 7 mm.

Figure 6:
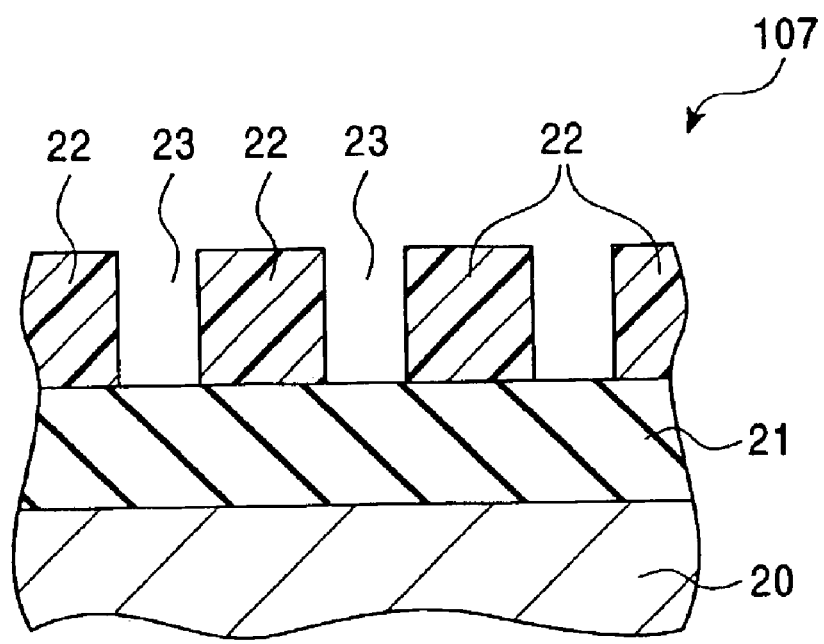
FIG. 6 is an exemplary cross-sectional view of a semiconductor device etched in an etching apparatus.

FIG. 6 is an exemplary partial cross-sectional view of the semiconductor device etched in the dry etching apparatus. The semiconductor wafer 107 shown in FIG. 1 has a SiO$_2$ film 21 with a thickness of 1.0 μm on a silicon substrate 20, as shown in FIG. 6. The SiO$_2$ film 21 is covered with a photoresist film 22 with a thickness of 1.2 μm. The photoresist film 22 has holes 23 with a diameter of 0.25 μm.

A plurality of semiconductor wafers 107 was successively introduced into the etching chamber 200, placed on the lower electrode 109, and processed by the plasma generated in the processing zone 106. In particular, the $SiO_2$ film 21 was etched using an etching gas atmosphere containing $CF_4$, $CHF_3$, $C_4F_8$, Ar, and CO. Among them, $CF_4$, $CHF_3$, $C_4F_8$ are fluorocarbon gasses.

The $SiO_2$ film 21 etching was continued until the accumulated RF discharge time reached 100 hours, which corresponds to the number of processed wafers of 2,000. The silicon electrode plate 101 was detached from the dry etching apparatus to be cleaned.

The silicon electrode plate 101 was cleaned with an ultrasonic power density of 24 $W/cm^2$. The frequency of the ultrasonic waves was 15 kHz, the area of the leading end 2a (ultrasonic radiating surface) of the horn 2 was 37.5 $cm^2$, and the input electric power was 900 W. The cleaning solvent was pure water with a temperature of 50° C. The distance between the leading end 2a of the horn 2 and the surface of the electrode plate 101a was 3 mm and the depth in the water of the leading end 2a of the horn 2 was 10 mm. The silicon electrode plate 101 was irradiated with ultrasonic waves for 10 minutes per gas nozzle. That is, each gas nozzle was exposed to the cavitation zone that extends through an entire depth of the gas nozzle for 10 minutes.

The silicon electrode plate 101 was subjected to a final ultrasonic cleaning in pure water for 10 minutes and then in isopropyl alcohol for 10 minutes, at an ultrasonic frequency of 28 kHz and an ultrasonic power density of 0.5 $W/cm^2$. The silicon electrode plate 101 was dried by high-pressure nitrogen blowing and then by heating in a clean oven at 60° C. for 6 hours.

The cleaned silicon electrode plate 101 was re-attached into the dry etching apparatus shown in FIG. 1. Again, a plurality of semiconductor wafers 107 was successively processed using the apparatus. The etching of the $SiO_2$ film 21 was continued until the accumulated RF discharge time reached 100 hours again. Number of particles with a diameter of 0.25 μm or more was counted every 10 hours of accumulated discharge time.

Figure 7:
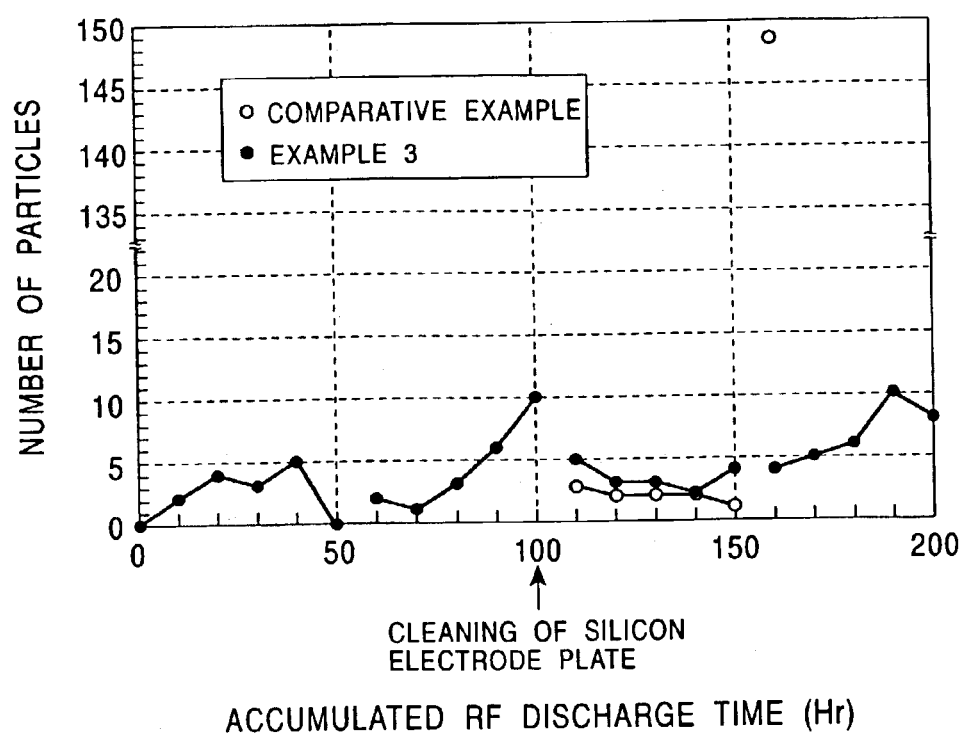
FIG. 7 is an exemplary graph showing the number of particles in EXAMPLE 3.

FIG. 7 shows the number of particles in the processing zone 106 of the dry etching apparatus. The horizontal axis represents the accumulated RF discharge time, and the vertical axis represents the number of particles counted on a wafer processed in the processing zone 106. The dry etching apparatus was stopped for maintenance every 50 hours of accumulated RF discharge. Therefore, the plot is disconnected at every 50 hours as shown in FIG. 7.

There is no meaningful difference in the number of particles in periods before (0 to 100 hours) and after (100–200 hours) the cleaning of the silicon electrode plate 101. This result shows that the cleanliness of the silicon electrode plate 101 is recovered to a level essentially the same as that of the new one by the cleaning method according to this invention utilizing the ultrasonic cleaning.

As a COMPARATIVE EXAMPLE, number of particles was also counted for a case that the silicon electrode plate 101 was not cleaned at 100 hours of accumulated discharge time and continuously used until 160 hours of accumulated discharge time. The counted numbers are shown in FIG. 7 with open circles. Note that the particle numbers are essentially the same as EXAMPLE 3 until 100 hours of accumulated discharge time, and are not shown in FIG. 7.

As can be seen in FIG. 7, the particle numbers for COMPARATIVE EXAMPLE are less than 5 and are essentially the same as those for EXAMPLE 3 until 150 hours of accumulated discharge time. Then, however, the particle number for COMPARATIVE EXAMPLE abruptly increases to nearly 150.

Conventionally, the silicon electrode pate 101 is used until the particle count increases at around 150 hours of accumulated RF discharge time as in the case COMPARATIVE EXAMPLE. When the particle count increases, the production yield of the semiconductor devices processed in the etching apparatus significantly decreases. EXAMPLE 3 solved this problem of the increased particle counts, and the decreased production yield around 150 hours of accumulated RF discharge time.

Further, EXAMPLE 3 extends the effective life of the silicon electrode plate 101. Conventionally, the effective life of the electrode plate is determined by the occurrence of the particle count increase to about 150 hours or less of the accumulated discharge time. On the other hand, the effective life of the electrode plate is extended to at least 200 hours of accumulated discharge time or more in EXAMPLE 3. Thus, the production cost related to the replacement parts can be decreased and the natural resources required to produce the new electrode plate can be reserved.

In EXAMPLE 3, the silicon electrode plate 101 was cleaned once and used until 200 hours of accumulated discharge time. However, it is also possible to clean the silicon electrode plate 101 twice or more times using the cleaning method according to this invention, and to further extend the effective life of the silicon electrode plate 101 to more than 200 hours of accumulated discharge time.

EXAMPLE 4

In this example, cleaning of the silicon electrode plate 101 was made as in EXAMPLE 3 except that the blast cleaning was performed as in EXAMPLE 2 after the ultrasonic cleaning. The dry etching apparatus, the silicon electrode plate, the semiconductor device to be processed, and the dry etching process were the same as those in EXAMPLE 3.

Figure 8:
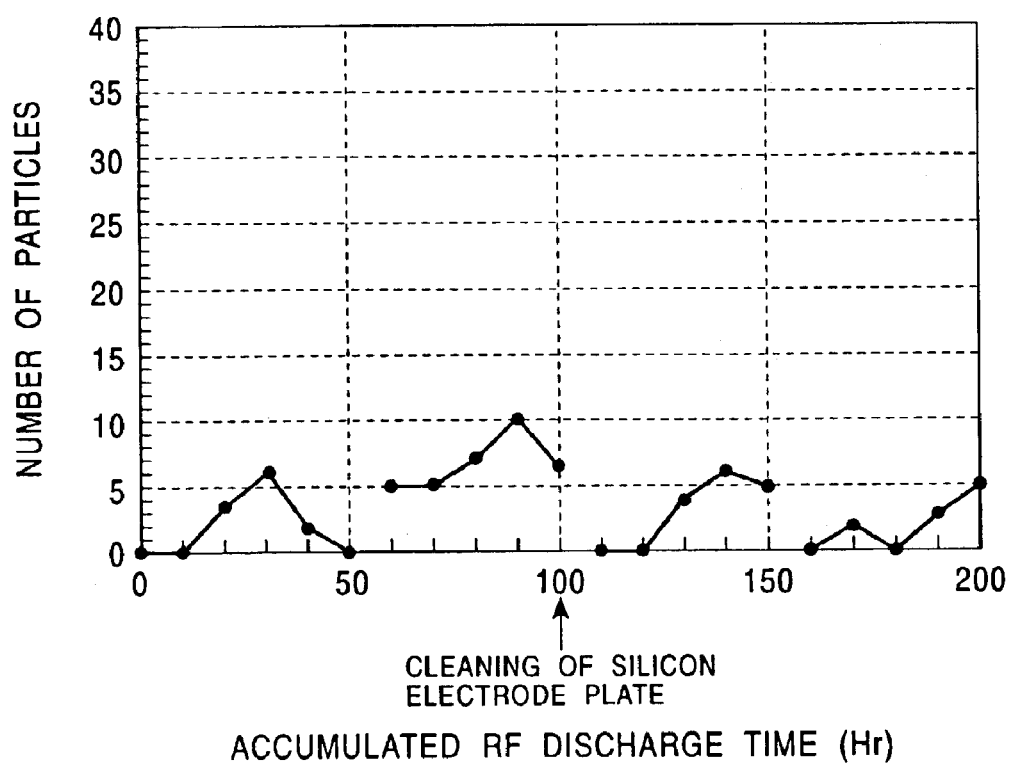
FIG. 8 is an exemplary graph showing the number of particles in EXAMPLE 4.

FIG. 8 is an exemplary graph showing a change in the cleanliness of the silicon electrode plate over time. The horizontal axis represents the accumulated RF discharge time, and the vertical axis represents the number of particles counted on a wafer processed in the processing zone 106. The plot is disconnected at every 50 hours, because the dry etching apparatus is stopped for maintenance every 50 hours of accumulated RF discharge time.

There is no meaningful difference in the number of particles in periods before (0 to 100 hours) and after (100–200 hours) the cleaning of the silicon electrode plate. The results show that the cleanliness of the silicon electrode plate 101 is recovered to the level essentially the same as that of the new one by the cleaning method according to this invention utilizing the ultrasonic cleaning followed by the blast cleaning.

EXAMPLE 4 also solved the problem of increased particle counts, and resultant decrease of production yield around 150 hours of accumulated RF discharge time. EXAMPLE 4 also extends the effective life of the silicon electrode plate. Thus, the production cost related to the replacement parts can be decreased and the natural resources required to produce the new electrode plate can be reserved.

Moreover, as can be seen by comparing FIGS. 7 and 8, the increase in the particle counts during the period of the accumulated RF discharge time of 150 to 200 hours is moderated in EXAMPLE 4 compared with the case of EXAMPLE 3. This result shows that the combination of the ultrasonic cleaning and the blast cleaning further improves the cleanliness of the electrode plate and suppresses the generation of particles.

As shown by EXAMPLE 3 and 4, method of producing semiconductor devices according to this invention is effective to increases the production yield, decreased the production cost, and reserve the natural resources.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A method of cleaning an electrode plate used in a plasma processing apparatus, the electrode plate having a plurality of gas nozzles through which a process gas is supplied to a processing zone of the plasma processing apparatus, the gas nozzles passing through an entire thickness of the electrode plate, the method comprising:

immersing the electrode plate in an cleaning agent; and removing deposited layers on inner walls of the gas nozzles formed when the electrode plate is used in the plasma processing apparatus, the removing including radiating ultrasonic waves toward a surface of the electrode plate having openings of the plurality of gas nozzles from an ultrasonic wave radiation surface of a horn connected to an ultrasonic vibrator, a power density of the ultrasonic waves defined by a ratio of an electric power input to the ultrasonic vibrator to an area of the ultrasonic wave radiation surface being not lower than 5 W/cm$^2$, wherein a square of a wavelength of the ultrasonic wave in the cleaning agent is larger than the area of the radiation surface.

2. The method according to claim 1, wherein the electrode plate is a silicon electrode plate, and the power density is not lower than 8 W/cm$^2$.

3. The method according to claim 2, wherein the power density is not lower than 18 W/cm$^2$.

4. A method of cleaning an electrode plate used in a plasma processing apparatus, the electrode plate having a plurality of gas nozzles through which a process gas is supplied to a processing zone of the plasma processing apparatus, the gas nozzles passing through an entire thickness of the electrode plate, the method comprising:

immersing the electrode plate in a cleaning agent; and removing deposited layers on inner walls of the gas nozzles formed when the electrode plate is used in the plasma processing apparatus, the removing including radiating ultrasonic waves toward a surface of the electrode plate having openings of the plurality of gas nozzles from an ultrasonic wave radiation surface of a horn connected to an ultrasonic vibrator, a power density of the ultrasonic waves defined by a ratio of an electric power input to the ultrasonic vibrator to an area of the ultrasonic wave radiation surface being not lower than 5 W/cm$^2$, wherein said removing further includes removing residues of the deposited layers by blasting pellets to the residues that remain after said radiating.

5. The method according to claim 4, wherein the pellets are dry ice pellets.

6. The method according to claim 4, wherein:

the electrode plate is a silicon electrode plate;

said radiating further removes, in addition to the deposited layers, intermediate layers between the inner walls of the gas nozzles and the deposited layers; and said blasting removes, in addition to the residues of the deposited layers, residues of the intermediate layers that remain after said radiating ultrasonic waves.

7. The method according to claim 4, wherein the electrode plate is a silicon electrode plate, and the power density is not lower than 8 W/cm$^2$.

8. The method to claim 7, wherein the power density is not lower than 18 W/cm$^2$.

9. A method of cleaning an electrode plate used in a plasma processing apparatus, the electrode plate having a plurality of gas nozzles through which a process gas is supplied to a processing zone of the plasma processing apparatus, the gas nozzles passing through an entire thickness of the electrode plate, the method comprising:

immersing the electrode plate in an cleaning agent; and removing deposited layers on inner walls of the gas nozzles formed when the electrode plate is used in the plasma processing apparatus, the removing including producing a cavitation zone that extends through an entire depth of the gas nozzles.

10. The method according to claim 9, wherein the electrode plate is a silicon electrode plate.

11. The method according to claim 9, wherein said removing further includes removing residues of the deposited layers by blasting pellets to the residues that remain after said producing of the cavitation zone.

12. The method according to claim 11, wherein the pellets are dry ice pellets.

13. The method according to claim 11, wherein:

the electrode plate is a silicon electrode plate;

said producing of the cavitation zone further removes, in addition to the deposited layers, intermediate layers formed between the inner walls of the gas nozzles and the deposited layers; and said blasting removes, in addition to the residues of the deposited layers, residues of the intermediate layers that remain after said producing of the cavitation zone.

14. A method of producing semiconductor devices, comprising:

attaching an electrode plate in a plasma processing apparatus, the electrode plate having a plurality of gas nozzles through which a process gas is supplied to a processing zone of the plasma processing apparatus, the gas nozzles passing through an entire thickness of the electrode plate;

processing a first plurality of semiconductor devices in the processing zone while forming deposited layers on inner walls of the gas nozzles;

detaching the electrode plate from the plasma processing apparatus;

cleaning the detached electrode plate, the cleaning comprising:

immersing the detached electrode plate in a cleaning agent; and removing the deposited layers from inner walls of the gas nozzles, the removing including producing a cavitation zone extending through an entire depth of the gas nozzles;

re-attaching the cleaned electrode plate to the plasma apparatus; and processing a second plurality of semiconductor devices in the plasma apparatus.

15. The method according to claim 14, wherein the electrode plate is a silicon electrode plate.

16. The method according to claim 14, wherein a radiofrequency power is supplied to the electrode plate during the processing of the semiconductor devices.

17. The method according to claim 14, wherein said producing of the cavitation zone includes radiating ultrasonic waves toward a surface of the electrode plate having openings of the gas nozzles from an ultrasonic wave radiation surface of a horn connected to an ultrasonic vibrator, a power density of the ultrasonic waves defined by a ratio of an electric power input to the ultrasonic vibrator to an area of the ultrasonic wave radiation surface is not lower than 5 $W/cm^2$.

18. The method according to claim 14, wherein said removing further includes removing residues of the deposited layers by blasting pellets to the residues that remain after said producing of the cavitation zone.

19. The method according to claim 18, wherein the pellets are dry ice pellets.

20. The method according to claim 18, wherein:
the electrode plate is a silicon electrode plate;
said producing of the cavitation zone further removes, in addition to the deposited layers, intermediate layers formed between the inner walls of the gas nozzles and the deposited layers; and
said blasting removes, in addition to the residues of the deposited layers, residues of the intermediate layers that remain after said producing of the cavitation zone.

21. A method of cleaning a component used in a plasma processing apparatus, the component having a plurality of holes through which a process gas is supplied to a processing zone of the plasma processing apparatus, the holes passing through an entire thickness of the component, the method comprising:

immersing the component in an cleaning agent; and
removing deposited layers on inner walls of the holes formed when the component is used in the plasma processing apparatus, the removing including producing a cavitation zone that extends through an entire depth of the holes.

22. The method according to claim 21, wherein the component is exposed to plasma within the processing zone of the plasma processing apparatus when the component is used in the apparatus.

23. The method according to claim 21, wherein the component is a silicon component.

24. The method according to claim 21, wherein said producing of the cavitation zone includes radiating ultrasonic waves toward a surface of the component having openings of the plurality of holes from an ultrasonic radiation surface of a horn connected to an ultrasonic vibrator, a power density of the ultrasonic waves defined by a ratio of an electric power input to the ultrasonic vibrator to an area of the ultrasonic wave radiation surface is not lower than 5 $W/cm^2$.

25. The method according to claim 21, wherein said removing further includes removing residues of the deposited layers that remain after said producing of the cavitation zone by blasting pellets to the residues.

26. The method according to claim 25, wherein the pellets are dry ice pellets.

27. The method according to claim 25, wherein:
the component is a silicon component;
said producing of the cavitation zone further removes, in addition to the deposited layers, intermediate layers formed between the inner walls of the gas nozzles and the deposited layers; and
said blasting removes, in addition to the residues of the deposited layers, residues of the intermediate layers that remain after said producing of the cavitation zone.

* * * * *